(12) United States Patent
Ogawa et al.

(10) Patent No.: US 7,022,399 B2
(45) Date of Patent: Apr. 4, 2006

(54) SEMICONDUCTOR DEVICE INTEGRATED MULTILAYER WIRING BOARD

(75) Inventors: Minoru Ogawa, Gifu (JP); Masahiro Izumi, Gifu (JP); Shigeyasu Itoh, Gifu (JP); Shingetsu Yamada, Nagahama (JP); Shuuji Suzuki, Nagahama (JP); Hiroo Kurosaki, Nagahama (JP)

(73) Assignees: Sony Corporation, Tokyo (JP); Mitsubishi Plastics, Inc., Tokyo (JP)

(*) Notice: Subject to any disclaimer, the term of this patent is extended or adjusted under 35 U.S.C. 154(b) by 0 days.

(21) Appl. No.: 10/357,097

(22) Filed: Feb. 3, 2003

(65) Prior Publication Data
US 2003/0178726 A1 Sep. 25, 2003

(30) Foreign Application Priority Data
Feb. 5, 2002 (JP) ............................. 2002-028236
Dec. 13, 2002 (JP) ............................. 2002-362558

(51) Int. Cl.
*B32B 15/00* (2006.01)
*B32B 3/00* (2006.01)
*B32B 7/00* (2006.01)

(52) U.S. Cl. ................... 428/209; 428/320.2; 428/901; 174/258; 174/264; 257/778

(58) Field of Classification Search ................ 257/758, 257/685, 686, 774, 775, 778; 428/209, 320.2, 428/901; 174/260, 258, 264
See application file for complete search history.

(56) References Cited

U.S. PATENT DOCUMENTS 5,306,670 A * 4/1994 Mowatt et al. ................ 29/832
5,375,042 A * 12/1994 Arima et al. ................ 361/784
5,773,882 A * 6/1998 Iwasaki ....................... 257/692
5,866,920 A * 2/1999 Matsumoto et al. .......... 257/63
5,883,335 A * 3/1999 Mizumoto et al. .......... 174/266
6,207,259 B1 * 3/2001 Iino et al. .................... 428/209
6,228,467 B1 * 5/2001 Taniguchi et al. .......... 428/209
6,359,235 B1 * 3/2002 Hayashi ...................... 174/260

(Continued)

FOREIGN PATENT DOCUMENTS

JP    P2000-38464    2/2000

(Continued)

*Primary Examiner*—Mary Wilczewski
*Assistant Examiner*—Monica Lewis
(74) *Attorney, Agent, or Firm*—Woodcock Washburn LLP

(57) ABSTRACT

The present invention provides a semiconductor device integrated multilayer wiring board with a high degree of heat resistance, which is capable of low temperature fusion without the occurrence of resin flow, enables high precision, finely detailed conductive wiring, thereby enabling the production of high density, ultra small three dimensional mounting modules and the like, can also be ideally applied to low volume high mix manufacturing configurations, and has little impact on the environment, and also provides a method of manufacturing such a semiconductor device integrated multilayer wiring board. In the semiconductor device integrated multilayer wiring board, a wiring substrate is formed by embedding conductive wiring within an insulating substrate, formed from a thermoplastic resin composition comprising a polyarylketone resin with a crystalline melting peak temperature of at least 260° C. and an amorphous polyetherimide resin as primary constituents, so that the surface of the wiring protrudes to the surface of the resin, and a plurality of these wiring substrates are laminated together, IC chips are mounted onto some of the wiring substrates, the insulating substrates of the wiring substrates are bonded together by thermal fusion, and the conductive wiring of each of the wiring substrates, and the wiring electrically connecting the wiring substrates together, is formed from a conductive material produced by curing a conductive paste.

7 Claims, 11 Drawing Sheets

U.S. PATENT DOCUMENTS

| | | |
|---|---|---|
| 6,538,210 B1 * | 3/2003 | Sugaya et al. .............. 174/258 |
| 6,797,367 B1 | 9/2004 | Ogawa et al. .............. 428/209 |
| 2003/0180510 A1 * | 9/2003 | Ogawa et al. .............. 428/209 |

FOREIGN PATENT DOCUMENTS

| | | |
|---|---|---|
| JP | P2001-119148 | 4/2001 |
| JP | P2001-196703 | 7/2001 |
| JP | P2001-230520 | 8/2001 |
| JP | P2001-244609 | 9/2001 |
| JP | P2001-257448 | 9/2001 |
| JP | P2002-248626 | 9/2002 |
| JP | P2002-260444 | 9/2002 |
| JP | P2002-261120 | 9/2002 |
| JP | P2002-261444 | 9/2002 |
| JP | P2002-270731 | 9/2002 |
| JP | P2002-290029 | 10/2002 |

* cited by examiner

FIG. 1
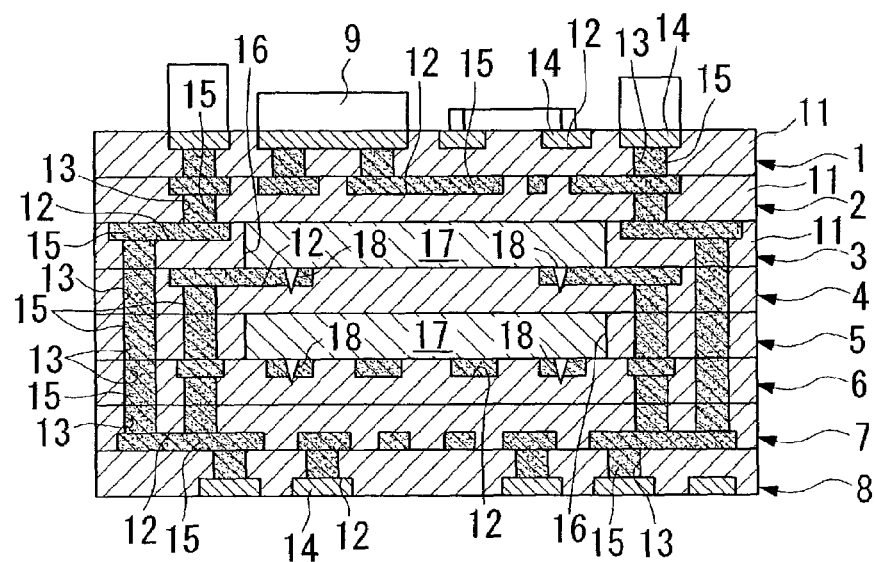
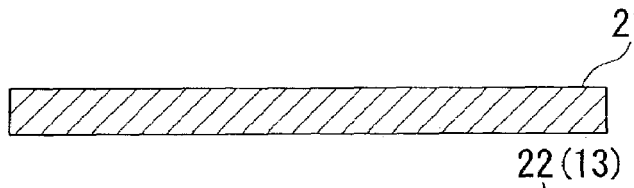
FIG. 2A
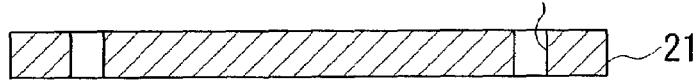
FIG. 2B
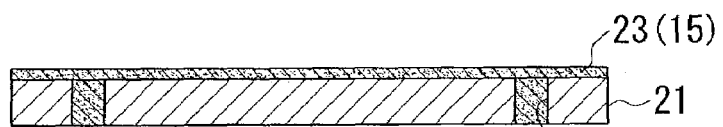
FIG. 2C
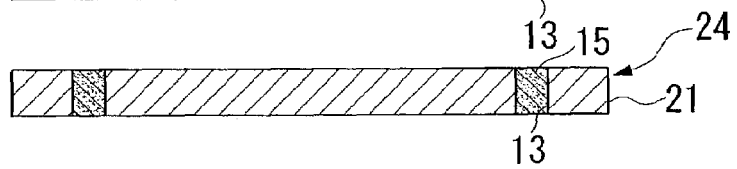
FIG. 2D FIG. 4
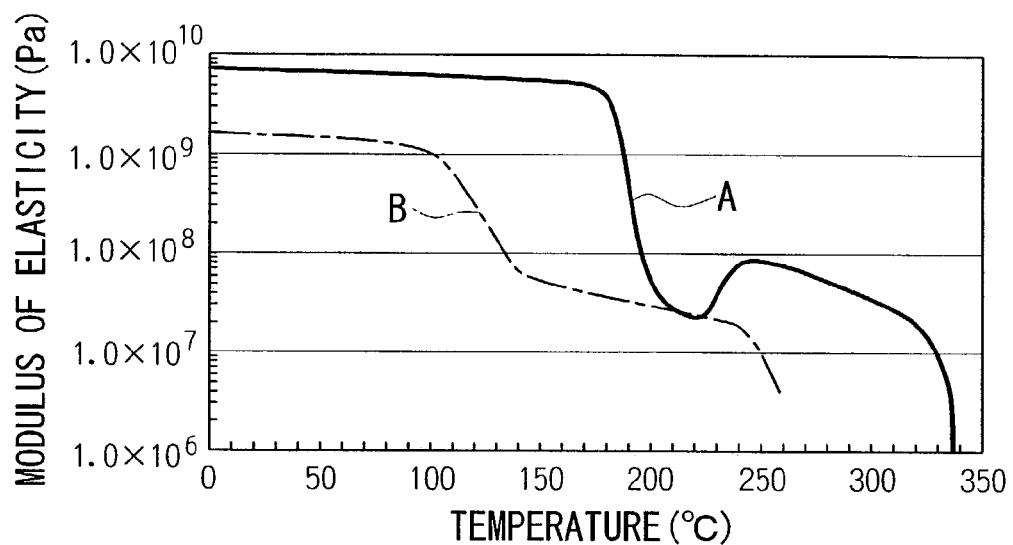
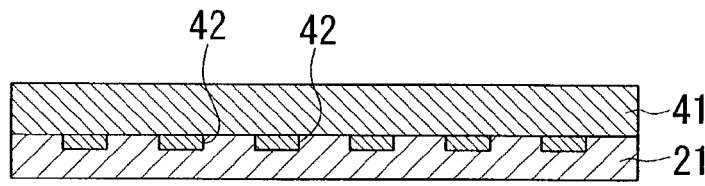
FIG. 5A
FIG. 5B
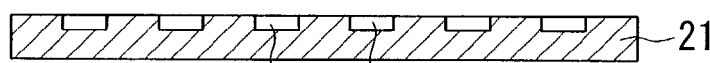
FIG. 5C
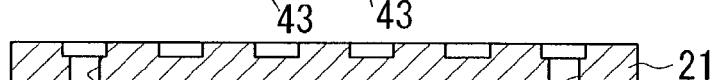
FIG. 5D
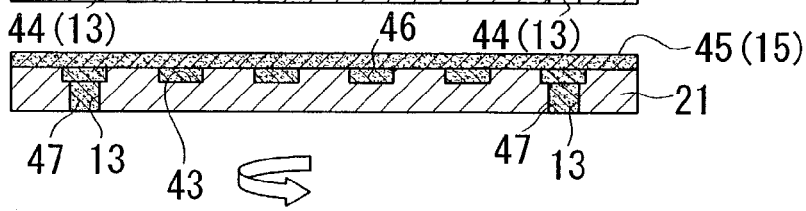
FIG. 5E
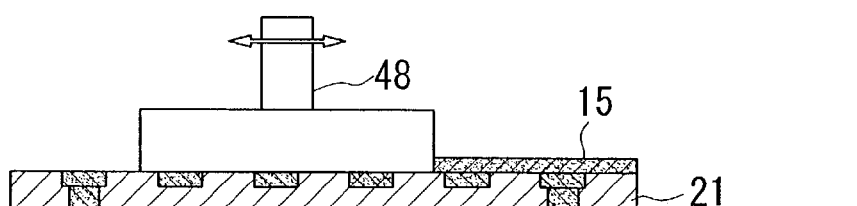
FIG. 5F
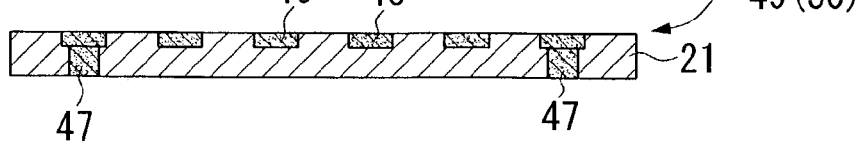

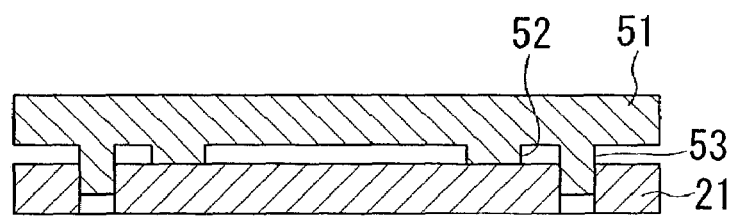
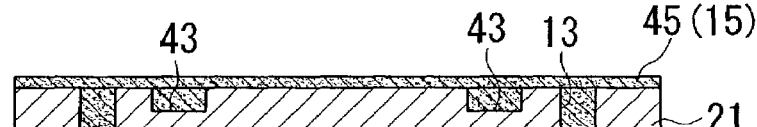
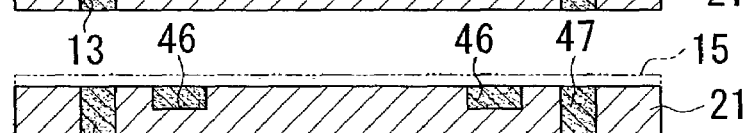
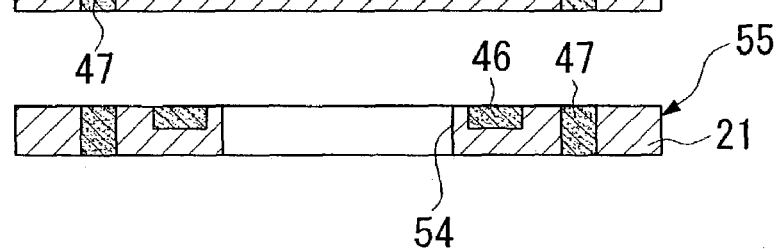

SEMICONDUCTOR DEVICE INTEGRATED MULTILAYER WIRING BOARD

BACKGROUND OF THE INVENTION

1. Field of the Invention

The present invention relates to a semiconductor device built-in multilayer wiring board and a method of manufacturing such a wiring board, and relates particularly to a semiconductor device built-in multilayer wiring board suitable for use in a high density, ultra small three dimensional mounting module formed by laminating a plurality of wiring substrates comprising a semiconductor device mounted on a wiring substrate, and to a method of manufacturing such a wiring board.

2. Description of Related Art

In recent years, by mounting not only passive components such as resistors and capacitors, but also small active components such as micro semiconductor packages, semiconductor bare chips and FBGA (fine pitch ball grid array), onto substrates such as printed laminates and ceramic laminates, the packaging density of components on the substrate has been increased, and surface mounting methods have been used to achieve improved miniaturization, and reductions in the weight and thickness of electronic devices. This type of surface mounting method seeks to reduce the size of each individual component.

Furthermore, in order to further improve the packaging density, three dimensional mounting modules are being developed, which employ three dimensional mounting technology to stack semiconductor devices in a three dimensional manner. In these three dimensional mounting modules, components which cannot be positioned via the surface mounting methods described above, especially large semiconductor devices, are either positioned vertically above the other components, or are embedded within the substrate, thereby enabling the packaging density to be increased.

The three dimensional mounting technology described above has recently become the focus of much attention, not only as a method of miniaturizing equipment, but also as a technology capable of contributing to increases in the speed of computers and communication equipment and the like.

For example, it is envisaged that video communication functions using an image capture element, Bluetooth interface functions and GPS functions and the like will be incorporated within communication devices, and the increase in the number of components accompanying this move towards greater functionality is creating a significant need for higher density packaging technology. In particular, if a number of semiconductor chips, which represent small semiconductor devices, are laminated and wired together in a three dimensional manner, then the length of wiring can be reduced, enabling the transmission of high speed signals, and as a result the adoption of three dimensional mounting technology is essential for future applications.

Three dimensional mounting technology can be broadly classified into two types. One type relates to three dimensional mounting modules in which components are laminated internally or onto a printed wiring board, and the other type relates to three dimensional mounting packages in which semiconductor chips are laminated together inside a package.

The former technology has gained very little popularity as it requires the equipment makers using such three dimensional mounting modules to undertake significant research and development of specialized mounting devices. In contrast, in the case of the latter technology, the electronic makers manufacturing such three dimensional mounting packages are seeking to differentiate themselves from other makers on the basis of the variety and number of semiconductor chips, and the number of laminated wiring boards within a package, or in the case of a similar package, on the basis of the variety of functions exhibited by the package, and consequently the LSI makers are beginning to commit significant resources to development of these packages.

One example of a three dimensional mounting package capable of laminating a plurality of semiconductor chips within a single package regardless of the type or shape of the chips is the System Block Module (SBM) developed by Toshiba Corporation (for example, refer to "Sanjigen mojuru no tenbo" (The outlook for three dimensional modules), by Morihiko Ikemizu, in Erekutoronikusu jisso gijutsu (Electronics Packaging Technologies), Gicho Publishing and Advertising Co., Ltd., April 2000, Vol. 16, No. 4, p. 32 to 34). This SBM uses a configuration in which semiconductor chips which have been reduced down to a thickness of 50 µm are mounted onto a heat resistant resin wiring board formed from a glass epoxy resin or the like, and a plurality of these wiring boards are then laminated together. With this type of SBM, the thickness of a single layer is approximately 140 µm, and consequently 7 chip layers can be laminated within a single package of thickness 1 mm. Furthermore, the wiring pattern between terminals is formed on those sections of the boards on which semiconductor chips are not mounted, and the chip terminals and the boards are connected electrically directly via Au bumps, whereas the electrical connections between semiconductor chips is achieved via wiring formed from a conductive material embedded within holes formed in boards sandwiched between each set of layers.

However, in conventional three dimensional mounting packages, because semiconductor chips are typically mounted on heat resistant resin wiring boards formed from a glass epoxy or the like, the shape and packaging density of the package are restricted by existing board materials and board processes, and consequently increases in the packaging density and further miniaturization are difficult to achieve beyond these restrictions.

For example, although heat resistant resins such as a glass epoxy resin offer advantages as highly heat resistant substrate materials, when the heat resistant resin is laminated and integrated into a single unit, the heat resistant resin must first be converted to a semi cured state, and this semi cured heat resistant resin must then be heated to enable thermal fusion, and a problem arises during this heating and thermal fusion in that a resin flow, resulting from a large reduction in the modulus of elasticity, may cause distortions in the conducting material which forms the wiring circuit.

In addition, conventional three dimensional mounting package production lines are suited to high volume low mix production, and consequently there is tendency for the production facilities to increase in size. Furthermore, wet processes such as chemical etching (wet etching) and plating techniques are typically used during the formation of wiring circuits on the glass epoxy heat resistant resin substrates, and these techniques are undesirable from the viewpoint of environmental impact.

Examples of alternative methods to these wet processes include dry processes such as screen printing methods and dispensing methods using a conductive paste, although in both of these methods, there is a limit to the improvements in detail and precision of the conductive wiring which can be achieved in order to try and meet the ever increasing demands for higher density packaging.

In addition, in a three dimensional mounting package using a conductive paste, the heat resistant resin must be heated to a temperature close to the melting point and subjected to pressure in order to fuse the heat resistant resin layers together and create a single integrated unit, and as the pitch of the wiring becomes finer, distortion of the wiring resulting from resin flow during lamination is increasingly becoming a factor which cannot be ignored in substrate design.

BRIEF SUMMARY OF THE INVENTION

The present invention aims to resolve the problems described above, with an object of providing a semiconductor device integrated multilayer wiring board with a high degree of heat resistance, which is capable of low temperature fusion without the occurrence of resin flow, enables high precision, finely detailed conductive wiring thereby enabling the production of high density, ultra small three dimensional mounting modules and the like, can also be ideally applied to low volume high mix manufacturing configurations, and has little impact on the environment, as well as providing a method of manufacturing such a semiconductor device integrated multilayer wiring board.

As a result of intensive research, the inventors of the present invention realized that if a substrate formed from a thermoplastic resin could be combined with a wiring pattern formed from a conductive paste to produce a wiring board suitable for semiconductor mounting, then a high performance, environmentally friendly semiconductor device integrated multilayer wiring board could be produced, and were hence able to complete the present invention.

In other words, in a semiconductor device integrated multilayer wiring board of the present invention, a wiring circuit is formed by embedding conductive wiring within an insulating substrate, formed from a thermoplastic resin composition comprising a polyarylketone resin with a crystalline melting peak temperature of at least 260° C. and an amorphous polyetherimide resin as the primary constituents, so that the surface of the wiring protrudes to the surface of the resin, and a plurality of wiring substrates, formed by smoothing the surface of an insulating substrate comprising embedded conductive wiring, are laminated together and wiring is provided which electrically connects the wiring substrates to each other, and of the plurality of wiring substrates, either one, or two or more wiring substrates have a semiconductor device mounted thereon, and the insulating substrates of the wiring substrates are bonded together and integrated into a single unit by thermal fusion and then crystallized, and the conductive wiring of the wiring circuit of each wiring substrate and the wiring used for electrically connecting each of the wiring substrates together, is formed from a conductive material produced by curing a conductive paste.

In this type of semiconductor device integrated multilayer wiring board, the insulating substrate which forms an essential component of the wiring substrate utilizes a thermoplastic resin composition comprising a polyarylketone resin with a crystalline melting peak temperature of at least 260° C. and an amorphous polyetherimide resin as the primary constituents, and by embedding the conductive wiring within the insulating substrate formed from this thermoplastic resin composition so that the surface of the wiring protrudes to the surface of the resin composition, and then smoothing and flattening the surface of the insulating substrate containing this conductive wiring, a wiring board with excellent heat resistance, a high degree of mechanical strength and excellent electrical insulation can be achieved, and in addition, low temperature fusion is possible without the occurrence of resin flow, meaning the problem of wiring distortions resulting from such resin flow can be resolved, making high precision, finely detailed conductive wiring possible. As a result, a semiconductor device integrated multilayer wiring board with excellent electrical characteristics and reliability can be provided.

Furthermore, by appropriate selection of both the thermoplastic resin composition, and the type and shape of the conductive wiring, a variety of different wiring substrates can be formed, and as a result, by combining wiring substrates with different specifications, the present invention can be applied to semiconductor device integrated multilayer wiring boards with a wide variety of specifications.

In addition, the combination of a variety of wiring substrates of different specifications makes the invention ideally suited to low volume high mix type manufacturing configurations. Furthermore, by using a conductive paste for the electrical connections, wiring formation using wet processes becomes unnecessary, meaning the environmental impact can be reduced.

The aforementioned insulating substrate preferably utilizes an amorphous film produced by molten mixing and then rapid cooling of a thermoplastic resin composition comprising a polyarylketone resin with a crystalline melting peak temperature of at least 260° C. and an amorphous polyetherimide resin as the primary constituents, and the difference between the glass transition temperature and the crystallization start temperature of this amorphous film is preferably within a range from 30° C. to 60° C.

The reason for this requirement is that for temperature differences of less than 30° C., crystallization proceeds rapidly, resulting in a deterioration in the thermal fusion properties of the insulating substrate when subjected to bonding and integration via thermal fusion. In contrast, for temperature differences exceeding 60° C., the degree of crystallization achieved following bonding and integration is low, resulting in inferior solder heat resistance.

A wiring substrate positioned adjacent to a wiring substrate on which a semiconductor device has been mounted preferably comprises a concave section or an opening to accommodate the semiconductor device.

The semiconductor device also preferably has an insulating film formed on at least the main surface on the opposite side of the device to where the electrical connections to the wiring substrate are provided.

By forming an insulating film on the aforementioned main surface of a semiconductor device, insulation can be ensured between this main surface and the conductive wiring of the adjacent insulating substrate.

Furthermore, forming an insulating film on at least the main surface of the semiconductor device on the opposite side of the device to where the electrical connections to the wiring substrate are provided, removes the requirement to form a passivation film on the semiconductor device, and also maintains a good level of electrical insulation between the semiconductor device and the conductive wiring of the adjacent wiring substrate, enabling an improvement in the reliability of both the semiconductor device and the conductive wiring.

Via holes are preferably formed in the wiring substrate on which the semiconductor device is mounted, in positions corresponding with each of the terminals of the semiconductor device, and a conductive material is used to fill these via holes, and each of the terminals of the semiconductor device is then preferably connected electrically to the conductive material in the corresponding via hole.

In addition, the aforementioned conductive wiring preferably comprises a conductive material formed by curing a conductive paste and a metallic foil, with at least the surface of the metallic foil protruding to the surface of the wiring.

A method of manufacturing a semiconductor device integrated multilayer wiring board according to the present invention comprises the steps of forming circuit formation grooves and via holes in a main surface of an insulating substrate formed from a thermoplastic resin composition comprising a polyarylketone resin with a crystalline melting peak temperature of at least 260° C. and an amorphous polyetherimide resin as the primary constituents, subsequently filling the circuit formation grooves and via holes with a conductive paste and forming a wiring substrate, subsequently mounting a semiconductor device onto either one, or two or more of a plurality of these wiring substrates, and subsequently laminating these wiring substrates together and creating a single integrated unit.

In this method of manufacturing a semiconductor device integrated multilayer wiring board, a semiconductor device is mounted on either one, or two or more wiring substrates generated by using a conductive paste to form a wiring circuit on an insulating substrate formed from a thermoplastic resin composition comprising a polyarylketone resin with a crystalline melting peak temperature of at least 260° C. and an amorphous polyetherimide resin as the primary constituents, and by laminating the wiring substrates together and forming a single integrated unit, a semiconductor device integrated multilayer wiring board with excellent heat resistance, a high degree of mechanical strength, excellent electrical insulation, and with high precision and finely detailed conductive wiring can be produced with relative ease. As a result, a semiconductor device integrated multilayer wiring board with excellent electrical characteristics and reliability can be produced with relative ease.

Furthermore, by appropriate selection of the number of wiring substrates and the wiring circuits formed thereon, semiconductor device integrated multilayer wiring boards with a wide variety of specifications can be produced with relative ease, meaning low volume high mix semiconductor device integrated multilayer wiring boards can be prepared easily, and within a relatively short time period. Furthermore, in the manufacturing process, by employing a dry process in which electrical connection is achieved via a conductive paste, wiring formation processes relying on wet processes become unnecessary, meaning the environmental impact of the manufacturing process is lessened considerably.

Furthermore, the aforementioned circuit formation grooves are preferably formed by thermal molding using an impressing jig, at a temperature which is higher than the glass transition temperature but lower than the crystallization start temperature of the aforementioned thermoplastic resin composition.

In addition, the semiconductor device is preferably fixed to the insulating substrate by thermocompression bonding, at a temperature which is higher than the glass transition temperature but lower than the crystallization start temperature of the aforementioned thermoplastic resin composition.

Furthermore, via holes could also be formed in the insulating substrate, in positions corresponding with each of the terminals of the semiconductor device which is to be mounted, an aforementioned conductive paste then used to fill these via holes and form a wiring substrate, and each of the terminals of the semiconductor device then embedded within the conductive paste filling these via holes.

In addition, following the filling of the aforementioned circuit formation grooves and via holes with a conductive paste, the conductive paste may be heated and cured to form a conductive material, and each of the terminals of the semiconductor device then embedded in this conductive material.

Another method of manufacturing a semiconductor device integrated multilayer wiring board according to the present invention is a method for manufacturing a semiconductor device integrated multilayer wiring board in which a semiconductor device is mounted on either one, or two or more of a plurality of wiring substrates, and the plurality of wiring substrates are then laminated and integrated into a single unit, comprising the steps of forming via holes in an insulating substrate formed from a thermoplastic resin composition comprising a polyarylketone resin with a crystalline melting peak temperature of at least 260° C. and an amorphous polyetherimide resin as the primary constituents, subsequently filling the via holes with a conductive paste, subsequently bringing a metallic foil in contact with one surface of the insulating substrate and bonding selective areas of the metallic foil onto the insulating substrate by thermocompression bonding, and subsequently peeling off the metallic foil, so that only those sections of the metallic foil bonded inside the via holes and/or in predetermined positions on the insulating substrate as a result of the thermocompression bonding remain as a wiring substrate on at least one outermost layer.

In this alternative method of manufacturing a semiconductor device integrated multilayer wiring board, by forming via holes in an insulating substrate formed from a thermoplastic resin composition comprising a polyarylketone resin with a crystalline melting peak temperature of at least 260° C. and an amorphous polyetherimide resin as the primary constituents, subsequently filling the via holes with a conductive paste, subsequently bringing a metallic foil in contact with one surface of the insulating substrate and bonding selective areas of the metallic foil onto the insulating substrate by thermocompression bonding, and subsequently peeling off the metallic foil, so that only those sections of the metallic foil inside the via holes and/or in predetermined positions on the insulating substrate are bonded as a result of the thermocompression bonding, these sections of metallic foil are bonded strongly to the substrate. Consequently, a semiconductor device integrated multilayer wiring board with excellent heat resistance, a high degree of mechanical strength, excellent electrical insulation, and with high precision and finely detailed conductive wiring can be produced with relative ease. As a result, a semiconductor device integrated multilayer wiring board with excellent electrical characteristics and reliability can be produced with relative ease.

Furthermore, by appropriate selection of the number of wiring substrates and the wiring circuits formed thereon, semiconductor device integrated multilayer wiring boards with a wide variety of specifications can be produced with relative ease, meaning low volume high mix semiconductor device integrated multilayer wiring boards can be prepared easily, and within a relatively short time period. Furthermore, in the manufacturing process, by employing a dry process in which electrical connection is achieved via a conductive paste, wiring formation processes relying on wet processes become unnecessary, meaning the environmental impact of the manufacturing process is lessened considerably.

When the aforementioned metallic foil is subjected to thermocompression bonding at a temperature A (° C.) which is higher than the glass transition temperature but lower than the crystallization start temperature (Tcs) of the aforementioned thermoplastic resin composition, followed by heat treatment at a temperature B (° C.) different from the temperature A (° C.), the temperature A (° C.) and the temperature B (° C.) should preferably satisfy the relationships:

A<B<Tcs, and B−A<10° C.

The reason for these requirements is that if the temperature A is less than the glass transition temperature, then thermocompression bonding of the metallic foil is impossible, whereas at temperatures greater than the crystallization start temperature, crystallization proceeds rapidly, resulting in a deterioration in the thermal fusion properties of the substrate when subjected to bonding and integration via thermal fusion.

In addition, by performing heat treatment at a temperature B lower than the crystallization start temperature, the bonding of the metallic foil can be further strengthened.

Furthermore, the lamination temperature during the lamination and integration into a single unit of the aforementioned plurality of wiring substrates, is preferably higher than the glass transition temperature but lower than the crystalline melt temperature of the aforementioned thermoplastic resin composition.

BRIEF DESCRIPTION OF THE SEVERAL VIEWS OF THE DRAWINGS

FIG. 1 is a cross-sectional diagram showing an IC chip integrated multilayer wiring board of a first embodiment of the present invention.

FIG. 2A through FIG. 2D are process diagrams showing a method of manufacturing an IC chip integrated multilayer wiring board of the first embodiment of the present invention.

FIG. 4 is a graph showing the temperature dependency of the modulus of elasticity of an insulating substrate and an elastic film.

FIG. 5A through FIG. 5F are process diagrams showing a method of manufacturing an IC chip integrated multilayer wiring board of the first embodiment of the present invention.

FIG. 6A through FIG. 6E are process diagrams showing a method of manufacturing an IC chip integrated multilayer wiring board of the first embodiment of the present invention.

DETAILED DESCRIPTION OF THE INVENTION

Figure 3A:
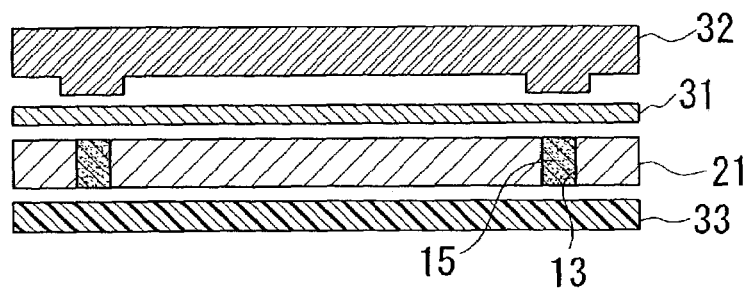
FIG. 3A through FIG. 3E are process diagrams showing a method of manufacturing an IC chip integrated multilayer wiring board of the first embodiment of the present invention.

As follows is a description of embodiments of a semiconductor device integrated multilayer wiring board of the present invention, and a method of manufacturing such a wiring board.

First Embodiment

FIG. 1 is a cross-sectional diagram showing an IC chip (semiconductor device) integrated multilayer wiring board according to a first embodiment of the present invention. In the figure, symbol 1 represents an uppermost layer substrate (a wiring substrate of the uppermost layer), symbol 2 represents a solid inner layer substrate (wiring substrate), symbol 3 represents an apertured (open) inner layer substrate (wiring substrate), symbol 4 represents an IC chip (semiconductor device) mounted inner layer substrate (wiring substrate), symbol 5 represents an apertured (open) inner layer substrate (wiring substrate), symbol 6 represents an IC chip (semiconductor device) mounted inner layer substrate (wiring substrate), symbol 7 represents a solid inner layer substrate (wiring substrate), symbol 8 represents a lowest layer substrate (a wiring substrate of the lowest layer), and symbol 9 represents an electronic component such as a resistor, a capacitor or an SMD mounted on top of the uppermost layer substrate 1.

The uppermost layer substrate 1 is typically a film, a thin plate or a sheet of a thickness of no more than 100 μm, wherein grooves 12 for forming a wiring circuit are formed in one surface (the upper surface in the figure) of an insulating substrate 11 formed from a film, a thin plate or a sheet of a thermoplastic resin composition comprising a polyarylketone resin with a crystalline melting peak temperature of at least 260° C. and an amorphous polyetherimide resin as the primary constituents, via holes (through holes) 13 are formed which pass through the insulating substrate 11, a metallic foil 14 is embedded within the grooves 12 so that the surface of the foil protrudes to the surface of the insulating substrate, and a conductive material 15 formed by curing a conductive paste is used to fill the via holes 13. Both the surface and the rear surface of the insulating substrate 11, including the metallic foil 14, have been smoothed and flattened.

The solid inner layer substrate 2 comprises grooves 12 for forming a wiring circuit formed in one surface (the upper surface in the figure) of an insulating substrate 11 formed from a film, a thin plate or a sheet of an identical thermoplastic resin composition to the uppermost layer substrate 1, and via holes 13 which pass through the insulating substrate 11, and a conductive material 15 formed by curing a conductive paste is used to fill the grooves 12 and the via holes 13. Both the surface and the rear surface of the insulating substrate 11, including the conductive paste 15, have been smoothed and flattened.

The apertured inner layer substrate 3 comprises grooves 12 for forming a wiring circuit formed in one surface (the upper surface in the figure) of an insulating substrate 11 formed from a film, a thin plate or a sheet of an identical thermoplastic resin composition to the uppermost layer substrate 1, and via holes 13 which pass through the insulating substrate 11, and a conductive material 15 formed by curing a conductive paste is used to fill the grooves 12 and the via holes 13. In addition, an aperture 16 for accommodating an IC chip 17, described below, is formed in the insulating substrate 11 at a predetermined position. Both the surface and the rear surface of the insulating substrate 11, including the conductive paste 15, have been smoothed and flattened.

The IC chip mounted inner layer substrate 4 comprises grooves 12 for forming a wiring circuit formed in one surface (the upper surface in the figure) of an insulating substrate 11 formed from a film, a thin plate or a sheet of an identical thermoplastic resin composition to the uppermost layer substrate 1, and via holes 13 which pass through the insulating substrate 11, and a conductive material 15 formed by curing a conductive paste is used to fill the grooves 12 and the via holes 13. In addition, an IC chip 17 such as a bare chip type is mounted onto the insulating substrate 11, and terminals 18 from this IC chip 17 are connected electrically to the wiring circuit formed by the conductive material 15.

The apertured inner layer substrate 5 comprises via holes 13 formed in an insulating substrate 11 formed from a film, a thin plate or a sheet of an identical thermoplastic resin composition to the uppermost layer substrate 1, and a conductive material 15 formed by curing a conductive paste is used to fill the via holes 13. In addition, an aperture 16 for accommodating an IC chip 17, described below, is formed in the insulating substrate 11 at a predetermined position. Both the surface and the rear surface of the insulating substrate 11, including the conductive paste 15, have been smoothed and flattened.

The IC chip mounted inner layer substrate 6 is of essentially the same construction as the IC chip mounted inner layer substrate 4 described above, but differs in the configuration of the wiring circuit, comprising the grooves 12 and the via holes 13 filled with a conductive material 15 formed by curing a conductive paste.

The solid inner layer substrate 7 is of essentially the same construction as the solid inner layer substrate 2 described above, but differs in the fact that the grooves 12 for forming the wiring circuit are formed in the lower surface of the insulating substrate 11, and in the configuration of the wiring circuit, comprising the grooves 12 and the via holes 13 filled with the conductive material 15.

The lowest layer substrate 8 is of essentially the same construction as the uppermost layer substrate 1, and differs in the fact that the grooves 12 for forming the wiring circuit are formed in the lower surface of the insulating substrate 11, with the metallic foil 14 embedded within the grooves 12 so that the surface of the foil protrudes to 4the surface of the insulating substrate, and in the configuration of the conductive material 15 used to fill the grooves 12 and the via holes 13, which forms the wiring circuit.

The substrates from the uppermost layer substrate 1 through to the lowest layer substrate 8 are laminated together in that sequence, and then bonded together, integrated into a single unit, and crystallized by thermocompression bonding, and the wiring circuits of each of the substrates 1 to 8, and the wiring for establishing the electrical connections between each set of adjacent substrates 1 to 8 is formed from the conductive material 15 produced by curing a conductive paste.

The polyarylketone resin with a crystalline melting peak temperature of at least 260° C., which represents one of the primary constituents of the thermoplastic resin composition used for forming the insulating substrate 11, is a thermoplastic resin comprising an aromatic linkage, an ether linkage and a ketone linkage within the structural unit, and representative examples include polyetherketones, polyetheretherketones and polyetherketoneketones. Examples of commercially available polyetheretherketones include PEEK151G, PEEK381G, and PEEK450G (all of which are manufactured by Victrex Co., Ltd.).

The amorphous polyetherimide resin is an amorphous thermoplastic resin comprising an aromatic linkage, an ether linkage and an imide linkage within the structural unit, and there are no other particular restrictions on the structure. Examples of commercially available polyetherimides include Ultem CRS5001 and Ultem 1000 (both manufactured by General Electric Company).

The actual resin composition of the thermoplastic resin composition described above is preferably produced by mixing 20 to 50 parts by weight of an inorganic filler with 100 parts by weight of a thermoplastic resin composition formed from 70 to 25% by weight of the polyarylketone resin and 30 to 75% by weight-of the amorphous polyetherimide resin.

The reason that the content of the polyarylketone resin is restricted to within a range from 70 to 25% by weight is because if the content exceeds 70% by weight, then the crystallinity becomes very high, making lamination more difficult when producing a multilayer structure, whereas if the content is less than 25% by weight, then the crystallinity of the overall composition falls, and the reflow heat resistance decreases even if the crystalline melting peak temperature is greater than 260° C.

Similarly, the reason that the content of the amorphous polyetherimide resin is restricted to within a range from 30 to 75% by weight is because if the content is less than 30% by weight, then the crystallinity becomes very high, making lamination more difficult when producing a multilayer structure, whereas if the content exceeds 75% by weight, then the crystallinity of the overall composition falls, and the reflow heat resistance decreases even if the crystalline melting peak temperature is greater than 260° C.

Inorganic fillers can also be added to a thermoplastic resin composition such as that described above.

There are no particular restrictions on the type of inorganic filler, and any known filler can be used. Specific examples of such inorganic fillers include talc, mica, glass flakes, boron nitride (BN), calcium carbonate flakes, aluminum hydroxide flakes, silica flakes, and potassium titanate flakes. These fillers may be used singularly, or in combinations of two or more different fillers. Scale-like flakes of inorganic fillers with an average particle diameter of no more than 15 μm and an aspect ratio (particle diameter/thickness) of more than 30 are particularly preferred, as they enable the ratio of the coefficients of linear expansion in the in-plane direction and the thickness direction to be suppressed to a low level, thereby suppressing the occurrence of cracking within the board during thermal shock cycle testing.

The quantity of these types of inorganic fillers added is preferably within a range from 20 to 50 parts by weight per 100 parts by weight of the thermoplastic resin composition. If the quantity exceeds 50 parts by weight, then problems develop, including unsatisfactory dispersion of the inorganic filler, and the coefficient of linear expansion is more likely to vary. In contrast, if the quantity of the filler is less than 20 parts by weight, then the difference in the coefficients of linear expansion of the glass stamper used in the thermal molding process and the insulating substrate 11 can cause a contraction in the dimensions of the insulating substrate 11, and the effect of the invention in reducing the coefficient of linear expansion and improving the dimensional stability is diminished, and in addition, internal stress develops during the reflow process as a result of the difference in the coefficient of linear expansion, making the board more susceptible to warping and twisting.

Other resins, and additives other than the inorganic fillers described above may also be added to a thermoplastic resin composition of the present invention, provided such addition does not impair the properties of the composition, and examples of these other additives include stabilizers, ultraviolet light absorbers, light stabilizers, nucleation agents, coloring agents, lubricants and flame retardants.

Each of these additives, including the inorganic fillers, can be added using known methods, such as the methods (a) and (b) described below.

(a) A method in which each of the additives is mixed at a high concentration (for example, a quantity of 10 to 60% by weight) with the polyarylketone resin and/or the amorphous polyetherimide resin (a base resin) to generate a master batch, and this master batch is then mixed with the resins to be used and the concentration adjusted appropriately, before the mixture is finally blended mechanically using a kneader or an extruder.

(b) A method in which each of the additives is added directly to the resins to be used, and then blended mechanically using a kneader or an extruder.

Of these two methods, the method (a) is preferable in terms of dispersibility and workability. In addition, the surface of the insulating substrate 11 may also be subjected to appropriate embossing or corona treatment or the like, in order to improve handling.

Furthermore, the aforementioned conductive material 15 is produced by heating and curing a conductive paste, and examples of suitable conductive pastes include resin based low temperature curing pastes such as silver (Ag) paste, silver (Ag)-palladium (Pd) paste, and copper (Cu) paste.

Next is a description of a method of manufacturing an IC chip integrated multilayer wiring board of this embodiment, based on FIG. 2A through FIG. 9.

First is a description of a method of manufacturing each of the wiring substrates, followed by a description of a method of manufacturing an IC chip integrated multilayer wiring board using these wiring substrates.

(1) Uppermost Layer Substrate

First, as shown in FIG. 2A, an insulating substrate 21 is prepared from a thermoplastic resin composition comprising a polyarylketone resin with a crystalline melting peak temperature of at least 260° C. and an amorphous polyetherimide resin as the primary constituents.

This insulating substrate 21 is provided as a film, a thin plate or a sheet. Examples of suitable methods for molding the substrate include conventionally known methods such as extrusion casting methods using a T die, or calender methods, and although there are no particular restrictions on the method employed, extrusion casting methods using a T die are preferred from the viewpoints of sheet film formation and production stability. The molding temperature in such a casting method using a T die can be suitably adjusted in accordance with the fluidity and the film formation properties of the composition, although generally, the temperature should be greater than the crystalline melting peak temperature of the polyarylketone resin (260° C.), but no more than 430° C.

Next, as shown in FIG. 2B, a laser or a mechanical drill or the like is used to open through holes 22 in predetermined positions within the insulating substrate 21, which then function as via holes 13.

Next, as shown in FIG. 2C, the via holes 13 are filled with a conductive paste 23 using a squeegee printing technique or the like. Subsequently, this conductive paste 23 is heated for 30 to 60 minutes at a temperature of 120 to 160° C., thereby curing the paste and forming a conductive material 15.

Subsequently, any residual conductive material 15 left on the surface of the insulating substrate 21 is ground off and removed using a technique such as mechanical polishing, yielding a wiring substrate 24 with the via holes 13 filled with a conductive material 15 formed by curing a conductive paste, and with the surface of the insulating substrate 21 smoothed to a predetermined surface roughness, as shown in FIG. 2D.

Figure 3B:
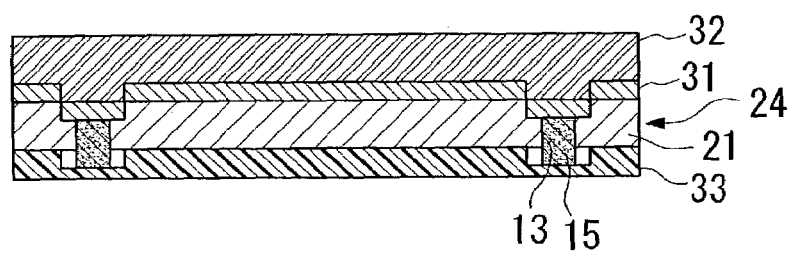

Next, as shown in FIG. 3A, an impressing jig 32 with texture formed on one of the principal surfaces is positioned on top (on one surface) of the insulating substrate 21 with a metallic foil 31 disposed therebetween, while an elastic film 33 which displays a lower modulus of elasticity than the insulating substrate 21 at temperatures lower than the glass transition temperature (Tg1) of the insulating substrate 21 is positioned on the lower surface (the other surface) of the insulating substrate 21. Subsequently, as shown in FIG. 3B, the impressing jig 32 is pressed against the insulating substrate 21, and thermocompression bonding is performed at a temperature A (° C.) which is greater than the glass transition temperature (Tg1) but lower than the crystallization start temperature (Tcs) of the insulating substrate 21.

Here, the glass transition temperature (Tg1) and the crystallization start temperature (Tcs) of the insulating substrate 21 can be measured using differential scanning calorimetry (DSC). These temperatures can be determined from the DSC profile obtained by raising the temperature at a heating rate of 10° C./minute, for example.

For example, in the case of an insulating substrate comprising 40% by weight of a polyarylketone resin with a crystalline melting peak temperature of at least 260° C., and 60% by weight of an amorphous polyetherimide resin, the glass transition temperature (Tg1) is 185° C. and the crystallization start temperature (Tcs) is 225° C.

Furthermore, provided the elastic film 33 displays a lower modulus of elasticity than the insulating substrate 21 at temperatures lower than the glass transition temperature (Tg1) of the insulating substrate 21, then any film is acceptable, and an elastic film formed from a syndiotactic polystyrene is an ideal example. The glass transition temperature (Tg2) of this elastic film 33 is 100° C.

FIG. 4 is a graph showing the temperature dependency of the modulus of elasticity of the insulating substrate 21 and the elastic film 33. In the figure, A represents the curve for an insulating substrate comprising 40% by weight of a polyarylketone resin with a crystalline melting peak temperature of at least 260° C., and 60% by weight of an amorphous polyetherimide resin, and B represents the curve for an elastic film formed from a syndiotactic polystyrene.

As shown in FIG. 4, the elastic film 33 undergoes softening prior to the softening of the insulating substrate 21, and as a result, the insulating substrate 21 flexes, but plastic deformation does not occur, and consequently the metallic foil 31 is able to cut efficiently.

The temperature of thermal molding is preferably greater than the glass transition temperature (Tg1) but lower than the crystallization start temperature (Tcs) of the insulating substrate 21.

Figure 3C:
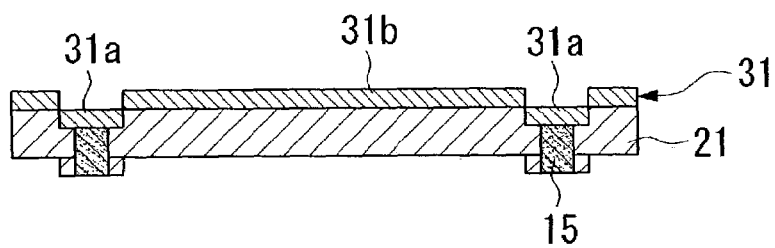

As a result of this thermocompression bonding, as shown in FIG. 3C, a pattern is stamped into the metallic foil 31 due to the difference in the modulus of elasticity between the elastic film 33 and the insulating substrate 21, and a difference in fusion strength develops which corresponds with the differing pressure applied by the texture of the impressing jig 32. For example, the metallic foil 31a embedded within the insulating substrate 21 has a high fusion strength and is bonded strongly to the insulating substrate 21, whereas the remaining sections of the metallic foil 31b have only very weak fusion strength, and can be easily stripped away from the insulating substrate 21.

Figure 3D:
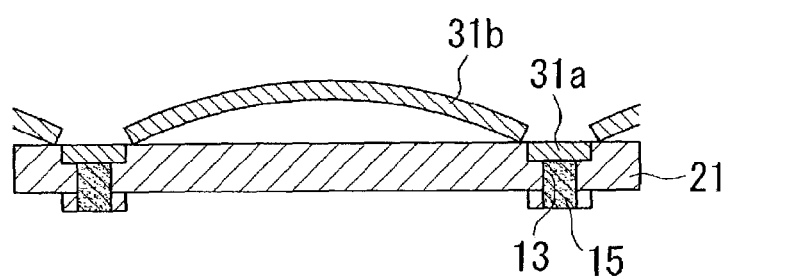

Consequently, as shown in FIG. 3D, the unnecessary metallic foil 31b can be easily stripped off the insulating substrate 21 and removed.

Subsequently, the metallic foil 31a is subjected to heat treatment at a temperature B (° C.) different from the temperature A (° C.). The temperature B is set so as to satisfy the relationships:
A<B<Tcs, and B−A<10° C.

To give (a specific example, when the thermocompression bonding temperature A is 190° C., the temperature B for the heat treatment could be 195° C.

The conductive material 15 formed by curing a conductive paste and the via holes 13 need not necessarily exist beneath the metallic foil 31, although by ensuring that the conductive material 15 is present beneath the entire metallic foil 31, the difference in fusion strength is magnified, and the unnecessary metallic foil 31b can be removed even more easily. Furthermore, there are no particular restrictions on the type or the thickness of the metallic foil 31, although the thickness of the metallic foil 31 is preferably less than the thickness provided by the height difference of the texture of the impressing jig 32. For example, in the case of a height difference of the texture of the impressing jig 32 of 50 μm, a surface roughened conductive copper foil (metallic foil) with a thickness of 9 to 35 μm was used, although even with other thickness values, stripping of the unnecessary conductive copper foil was still possible.

Figure 3E:
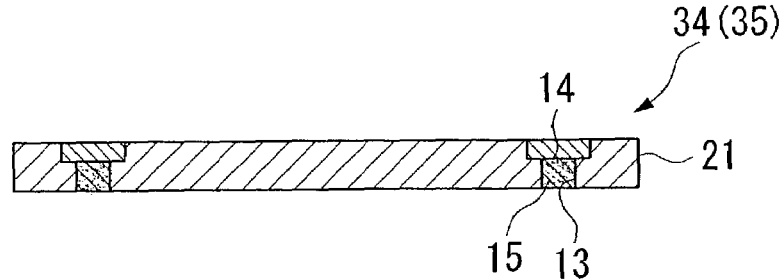

Following removal of the unnecessary metallic foil 31b from the insulating substrate 21, as shown in FIG. 3E, both surfaces of the insulating substrate 21 including the metallic foil 31a and the conductive material 15 are subjected to thermal molding using a molding die not shown in the figure, at a pressure of 0.5 to 10 kg/cm² and at a temperature lower than the crystallization start temperature (Tcs) of the insulating substrate 21, thereby smoothing and flattening both surfaces of the insulating substrate 21 including the metallic foil 31a and the conductive material 15.

Using the steps described above, the metallic foil 14 can be embedded in the insulating substrate 21 with the surface of the foil protruding to the surface of the insulating substrate, and an uppermost layer substrate 34 with the via holes 13 filled with the conductive material 15 can be produced.

The lowest layer substrate 35 can be produced using an identical method to that described above for the uppermost layer substrate 34.

(2) Solid Inner Layer Substrate

First, as shown in FIG. 5A, convex sections 42 of a stamper 41 are thermally transferred to a surface (one surface) of an insulating substrate 21 formed from an identical thermoplastic resin composition to that used for the outermost layer substrates described above. The conditions for this thermal transfer include, for example, a temperature of 175 to 205° C. and a pressure of 20 to 60 kg/cm².

This thermal transfer forms wiring circuit formation grooves 43 in the surface of the insulating substrate 21, as shown in FIG. 5B.

The stamper 41 is constructed from a material with good releasability relative to the insulating substrate 21, such as glass or ceramic. Heat resistant glass of thickness 3 to 5 mm is particularly suitable. The stamper 41 is produced by forming a resist mask on the surface of a heat resistant glass plate using photolithography techniques, and subsequently forming the convex sections 42 which correspond with the wiring circuit pattern using the resist mask with sand blasting techniques or the like.

Next, as shown in FIG. 5C, a laser or a mechanical drill or the like is used to open through holes 44 in predetermined positions within the insulating substrate 21, which then function as via holes 13. These via holes 13 may also be formed by the stamper 41, at the same time as the formation of the wiring circuit formation grooves 43.

Next, as shown in FIG. 5D, the wiring circuit formation grooves 43 and the via holes 13 are filled with a conductive paste 45 using a squeegee printing technique or the like. Subsequently, this conductive paste 45 is heated for 30 to 60 minutes at a temperature of 120 to 160° C., thereby curing the paste and forming a conductive material 15. This process enables the formation of a conductive circuit 46 and interlayer continuity sections 47, formed from the conductive material 15 at predetermined positions on the insulating substrate 21.

Subsequently, as shown in FIG. 5E, a sanding device 48 is used to grind off and remove any residual conductive material 15 left on the surface of the insulating substrate 21, and smooth the surface of the insulating substrate 21, yielding a solid inner layer substrate 49 with a conductive circuit 46 and interlayer continuity sections 47 formed at predetermined positions on the insulating substrate 21, as shown in FIG. 5F.

Furthermore, a solid inner layer substrate 50 with a different wiring pattern from the inner layer substrate 49 can be produced using an identical method to that described above for the inner layer substrate 49.

(3) Apertured Inner Layer Substrate (part 1)

Apertured Inner Layer Substrate comprising a Wiring Circuit and Via Holes

First a shown in FIG. 6A, convex sections 52, 53 of a stamper 51 are thermally transferred to a surface (one surface) of an insulating substrate 21 formed from an identical thermoplastic resin composition to that used for the outermost layer substrates described above, using a similar method to that described above for the solid inner layer substrate. In this example, the convex sections 52 are used for forming wiring circuit formation grooves, whereas the convex sections 53 are used for forming through holes to function as via holes. The conditions for this thermal transfer include, for example, a temperature of 190 to 205° C. and a pressure of 20 to 60 kg/cm$^2$.

The stamper 51 is constructed from a material with good releasability relative to the insulating substrate 21, such as glass or ceramic. Heat resistant glass of thickness 5 to 10 mm is particularly suitable. The stamper 51 is produced by forming a resist mask on the surface of a heat resistant glass plate using photolithography techniques, and subsequently forming the convex sections 52 which correspond with the wiring circuit pattern, and the convex sections 53 which correspond with the via hole pattern, using the resist mask with sand blasting techniques or the like.

As a result of this thermal transfer, wiring circuit formation grooves 43 are formed in the surface of the insulating substrate 21, and through holes 44 (via holes 13) are formed which pass through the insulating substrate 21, as shown in FIG. 6B.

Next, as shown in FIG. 6C, the wiring circuit formation grooves 43 and the via holes 13 are filled with a conductive paste 45 using a squeegee printing technique or the like. Subsequently, this conductive paste 45 is heated for 30 to 60 minutes at a temperature of 120 to 160° C., thereby curing the paste and forming a conductive material 15. This process enables the formation of a conductive circuit 46 and interlayer continuity sections 47 at predetermined positions on the insulating substrate 21.

Subsequently, as shown in FIG. 6D, a sanding device, which is not shown in the figures, is used to grind off and remove any residual conductive material 15 left on the surface of the insulating substrate 21, and smooth the surface of the insulating substrate 21, yielding a substrate with a conductive circuit 46 and interlayer continuity sections 47 formed at predetermined positions on the insulating substrate 21.

Next, a punch type molding device, which is not shown in the figures, is used to punch out an aperture 54 for accommodating an IC chip at a predetermined location in the insulating substrate 21, thereby yielding an apertured inner layer substrate 55 shown in FIG. 6E.

(4) Apertured Inner Layer Substrate (part 2)

Apertured Inner Layer Substrate Comprising Only Via Holes

Figure 7A:
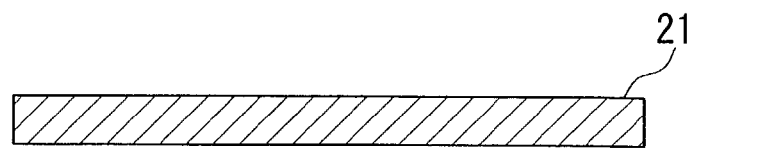
FIG. 7A through FIG. 7E are process diagrams showing a method of manufacturing an IC chip integrated multilayer wiring board of the first embodiment of the present invention.
Figure 7B:
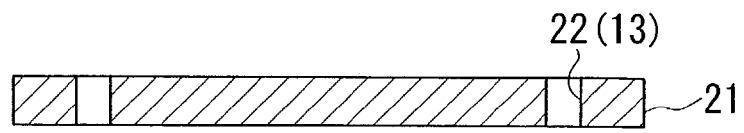

First, as shown in FIG. 7A, an insulating substrate 21 is prepared from an identical thermoplastic resin composition to that used for the outermost layer substrates described above, and a laser or a mechanical drill or the like is then used to open through holes 22 in predetermined positions within the insulating substrate 21, which then function as via holes 13, as shown in FIG. 7B.

Figure 7C:
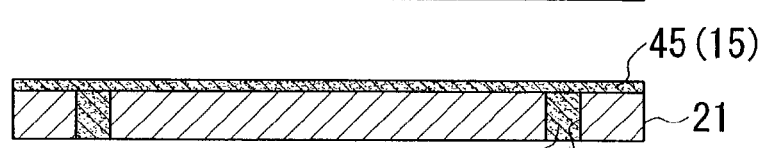

Next, as shown in FIG. 7C, the via holes 13 are filled with a conductive paste 45 using a squeegee printing technique or the like, and this conductive paste 45 is then heated for 30 to 60 minutes at a temperature of 120 to 160° C., thereby curing the paste and forming a conductive material 15. This process enables the formation of interlayer continuity sections 47 at predetermined positions on the insulating substrate 21.

Figure 7D:
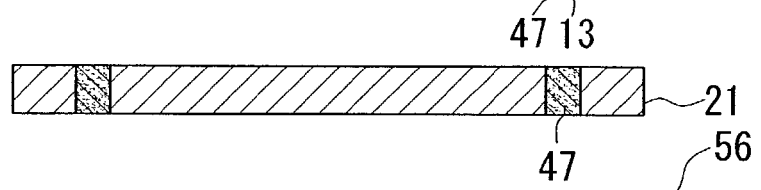

Subsequently, as shown in FIG. 7D, a sanding device, which is not shown in the figures, is used to grind off and remove any residual conductive material 15 left on the surface of the insulating substrate 21, and smooth the surface of the insulating substrate 21, yielding a substrate with the interlayer continuity sections 47 formed at predetermined positions on the insulating substrate 21.

Figure 7E:
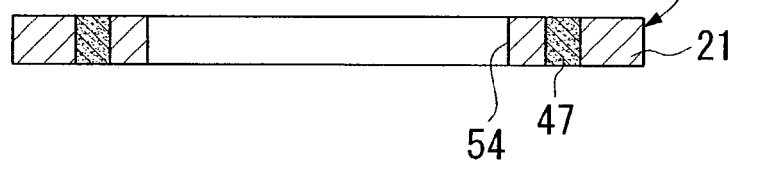

Next, a punch type molding device, which is not shown in the figures, is used to punch out an aperture 54 for accommodating an IC chip at a predetermined location in the insulating substrate 21, thereby yielding an apertured inner layer substrate 56 shown in FIG. 7E.

(5) IC Chip Mounted Inner Layer Substrate

An IC chip mounted inner layer substrate can be prepared using a solid inner layer substrate 49 produced using the method of manufacturing an inner layer substrate described above.

Figure 8A:
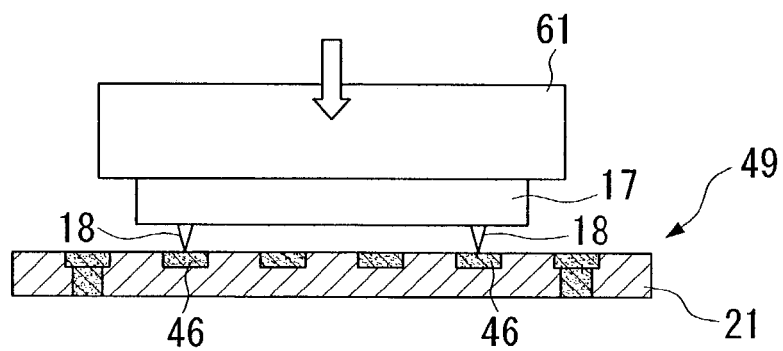
FIG. 8A and FIG. 8B are process diagrams showing a method of manufacturing an IC chip integrated multilayer wiring board of the first embodiment of the present invention.

First, an IC chip 17 is positioned at a predetermined position above the insulating substrate 21, as shown in FIG. 8A. A thermocompression bonding jig 61 with an internal heater is then placed on top of the IC chip 17, and the IC chip 17 is thermocompression bonded to the insulating substrate 21 using this thermocompression bonding jig 61. The thermocompression bonding is performed under conditions including, for example, a temperature of 180 to 200° C. and a pressure of 10 to 100 kg/cm$^2$.

Figure 8B:
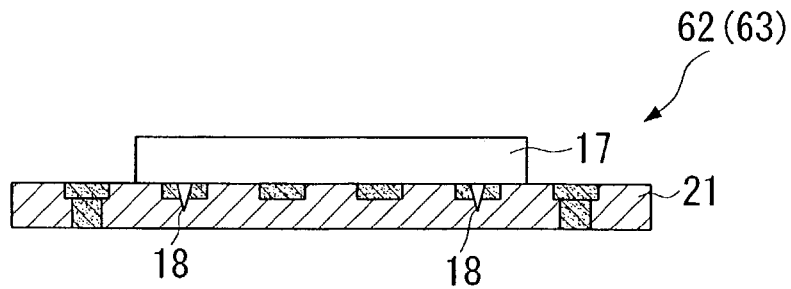

As shown in FIGS. 8A and 8B, as a result of this thermocompression bonding, terminals 18 on this IC chip 17 are connected electrically to the conductive circuit 46 of the insulating substrate 21, yielding an IC chip mounted inner layer substrate 62 in which the IC chip 17 and the insulating substrate 21 have been integrated into a single unit. Furthermore, if an insulating substrate 21 with a different conductive circuit pattern 46 is used, then an IC chip mounted inner layer substrate 63 with a different wiring circuit from that described above can be produced.

(6) IC chip Integrated Multilayer Wiring Board

Figure 9:
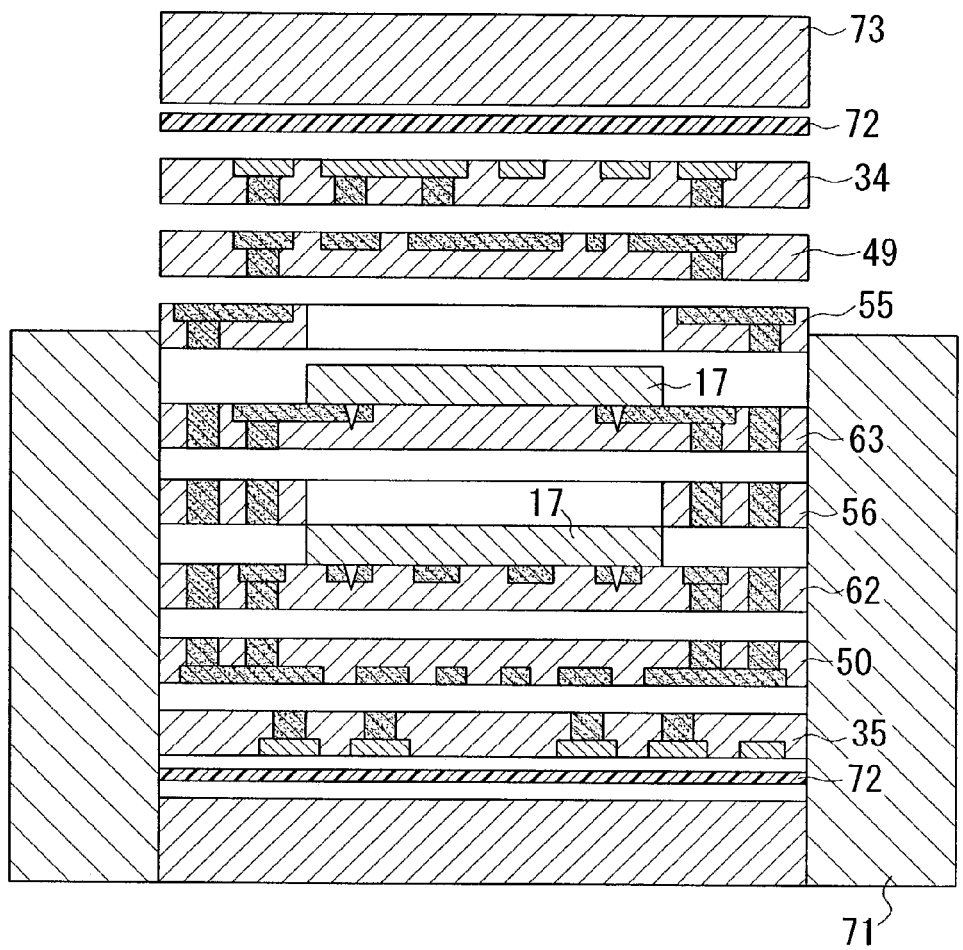
FIG. 9 is a process diagram showing a method of manufacturing an IC chip integrated multi layer wiring board of the first embodiment of the present invention.

First, as shown in FIG. 9, a cushion film 72 with good elasticity and releasability, a lowest layer substrate 35, an inner layer substrate 50, an IC chip mounted inner layer substrate 62, an apertured inner layer substrate 56, an IC chip mounted inner layer substrate 63, an apertured inner layer substrate 55, an inner layer substrate 49, an uppermost layer substrate 34, and another cushion film 72 with good elasticity and releasability are overlaid, in the above sequence, within a lamination jig 71 with an internal heater. Subsequently, by pressing a compression jig 73 downward, the layers from the lowest layer substrate 35 through to the uppermost layer substrate 34 are subjected to thermocompression bonding, thereby laminating the layers from the lowest layer substrate 35 through to the uppermost layer substrate 34 together, and forming a single integrated unit.

This thermocompression bonding is effective if performed at a temperature greater than the glass transition temperature (Tg) but lower than the crystalline melt temperature (Tm) of the thermoplastic resin composition of the insulating substrate 21.

An example of suitable conditions for the thermocompression bonding includes a temperature within a range from 220 to 300° C., and a pressure from 10 to 60 kg/cm$^2$.

Subsequently, an electronic component 9 such as a resistor, a capacitor or an SMD can be mounted on top of the uppermost layer substrate 1, thereby forming an IC chip integrated multilayer wiring board of the present embodiment.

According to the present embodiment, conductive wiring formed from the metallic foil 14 and/or the conductive material 15 is embedded in the insulating substrate 11 formed from a thermoplastic resin composition comprising a polyarylketone resin with a crystalline melting peak temperature of at least 260° C. and an amorphous polyetherimide resin as the primary constituents, so that the surface of the conductive wiring protrudes to the surface of the insulating substrate, and with the surface of this insulating substrate 11, including the conductive wiring, in a smoothed and flattened state, the wiring substrates 1 to 8 are laminated together, IC chips 17 are mounted onto the wiring substrates 4, 6, and these wiring substrates 1 to 8 are then bonded together using thermal fusion, and also connected together electrically using the conductive material 15 formed by curing a conductive paste, and consequently a multilayer wiring board can be produced which displays excellent heat resistance, a high degree of mechanical strength and excellent electrical insulation, and which is capable of low temperature fusion without the occurrence of resin flow, enables the problems resulting from resin flow such as wiring distortion to be resolved, and enables high precision, finely detailed conductive wiring. As a result, an IC chip integrated multilayer wiring board with excellent electrical characteristics and reliability can be provided.

Furthermore, by appropriate selection of both the thermoplastic resin composition, and the type and shape of the conductive wiring, a variety of different wiring substrates can be formed, and as a result, by combining wiring substrates and IC chips with different specifications, the present invention can be applied to IC chip integrated multilayer wiring boards with a wide variety of specifications.

In addition, the combination of a variety of wiring substrates of different specifications makes the invention ideally suited to low volume high mix type manufacturing configurations. Furthermore, by using a conductive paste for the electrical connections, wiring formation using wet processes becomes unnecessary, meaning the environmental impact can be reduced.

Second Embodiment

Figure 10:
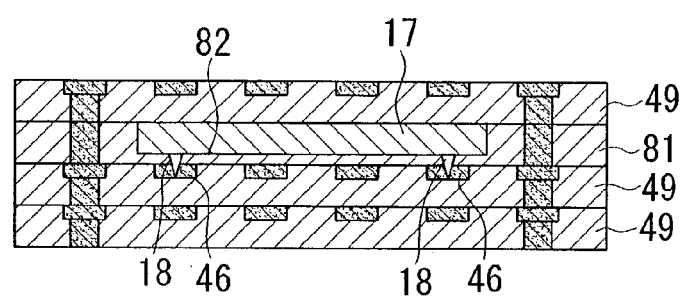
FIG. 10 is a cross-sectional diagram showing an IC chip integrated multilayer wiring board of a second embodiment of the present invention.

FIG. 10 is a cross-sectional diagram showing an IC chip (semiconductor device) integrated multilayer wiring board of a second embodiment of the present invention. In the figure, symbol 81 represents an IC chip accommodating inner layer substrate in which via holes 13 are formed in an insulating substrate 21, and a concave section 82 for accommodating an IC chip 17 is formed in a predetermined location in the surface of the insulating substrate 21.

The IC chip integrated multilayer wiring board is produced by overlaying inner layer substrates 49, 49, the IC chip accommodating inner layer substrate 81, the IC chip 17 and another inner layer substrate 49 in that sequence, and then using thermocompression bonding to batch laminate these layers into a single integrated unit.

As follows is a description of a method of manufacturing an IC chip integrated multilayer wiring board of the present embodiment, based on FIG. 11A through FIG. 11D, and FIG. 12A to FIG. 12B.

The method of manufacturing the inner layer substrates 49 has already been described in relation to the first embodiment, and is consequently omitted here. Accordingly, first is a description of a method of manufacturing the IC chip accommodating inner layer substrate 81, followed by a description of a method for batch laminating the substrates.

(1) IC Chip Accommodating Inner Layer Substrate

Figure 11A:
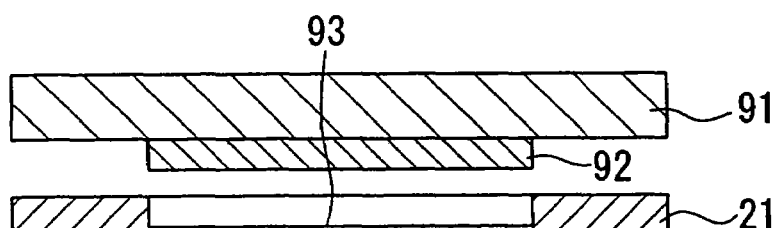
FIG. 11A through FIG. 11D are process diagrams showing a method of manufacturing an IC chip integrated multilayer wiring board of the second embodiment of the present invention.

First, as shown in FIG. 11A, a convex section 92 of a stamper 91 is thermally transferred to a surface (one surface) of an insulating substrate 21 formed from a thermoplastic resin composition comprising a polyarylketone resin with a crystalline melting peak temperature of at least 260° C. and an amorphous polyetherimide resin as the primary constituents. The conditions for this thermal transfer include, for example, a temperature of 190 to 205° C. and a pressure of 20 to 60 kg/cm².

This thermal transfer forms a concave section 93 for accommodating an IC chip 17 in the surface of the insulating substrate 21.

The stamper 91 is constructed using a similar method to that described for the stamper 41 used in the first embodiment.

Figure 11B:
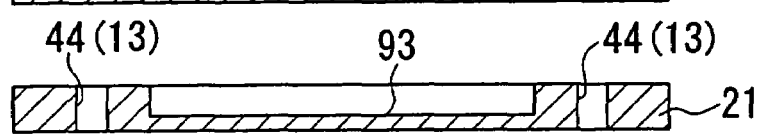

Subsequently, as shown in FIG. 11B, a laser or a mechanical drill or the like is used to open through holes 44 in predetermined positions within the insulating substrate 21, which then function as via holes 13.

Figure 11C:
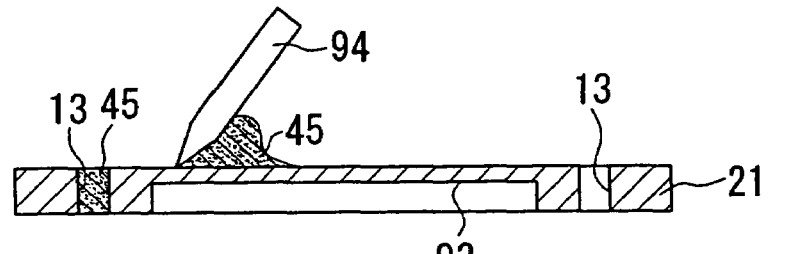
Figure 11D:
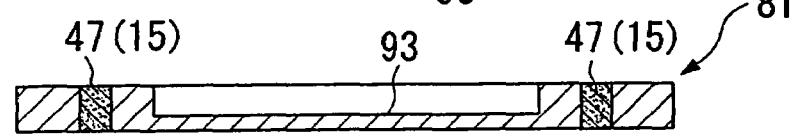

Then, as shown in FIG. 11C, the insulating substrate is inverted, and the via holes 13 are filled with a conductive paste 45 from the underside of the insulating substrate 21, using a squeegee 94. The conductive paste 45 is then heated for 30 to 60 minutes at a temperature of 120 to 160° C., thereby curing the paste and forming a conductive material 15. This process enables the formation of an IC chip accommodating inner layer substrate 81 with a concave section 93 for accommodating an IC chip 17 and interlayer continuity sections 47 formed from the conductive material 15 formed at predetermined positions on the insulating substrate 21, as shown in FIG. 11D.

(2) IC Chip Integrated Multilayer Wiring Board

Figure 12A:
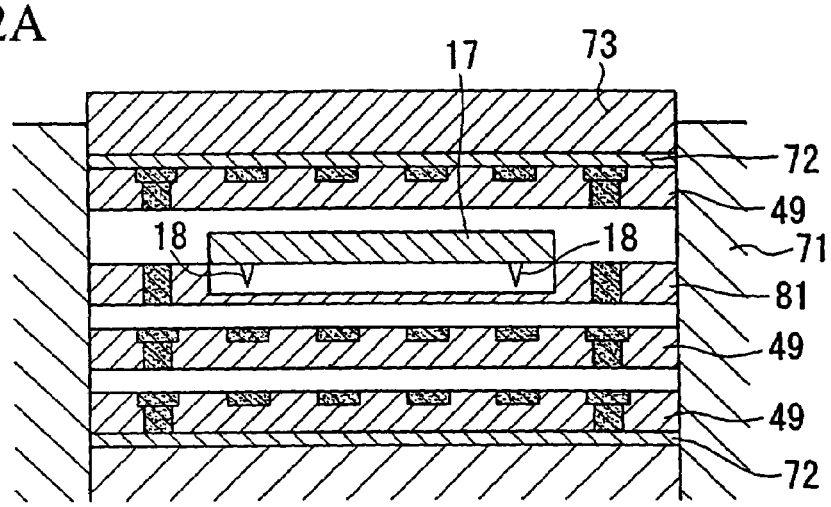
FIG. 12A and FIG. 12B are process diagrams showing a method of manufacturing an IC chip integrated multilayer wiring board of the second embodiment of the present invention.

As shown in FIG. 12A, a cushion film 72 with good elasticity and releasability, inner layer substrates 49, 49, an IC chip accommodating inner layer substrate 81, an IC chip 17, an inner layer substrate 49, and another cushion film 72 with good elasticity and releasability are overlaid, in the above sequence, within a lamination jig 71 with an internal heater. Subsequently, by pressing a compression jig 73 with an internal heater downward, the inner layer substrates 49, 49, the IC chip accommodating inner layer substrate 81, the IC chip 17, and the inner layer substrate 49 are subjected to thermocompression bonding, thereby batch laminating the layers and forming a single integrated unit.

This thermocompression bonding is effective if performed at a temperature greater than the glass transition temperature (Tg) but lower than the crystalline melt temperature (Tm) of the thermoplastic resin composition of the insulating substrate 21.

An example of suitable conditions for this thermocompression bonding includes a temperature within a range from 220 to 240° C., and a pressure from 10 to 60 kg/cm²

Figure 12B:
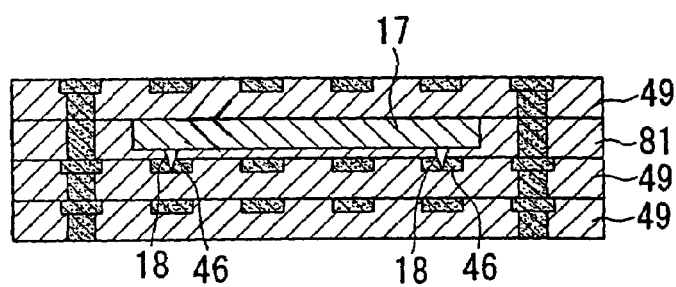

As a result of the above thermocompression bonding process, terminals 18 of the IC chip 17 are connected electrically to the conductive circuit 46 of the insulating substrate 21, and the IC chip 17 and the insulating substrate 21 are laminated together into a single integrated unit, as shown in FIG. 12B.

This process enables the production of an IC chip integrated multilayer wiring board of the present embodiment.

This second embodiment produces similar effects to those described for the IC chip integrated multilayer wiring board of the first embodiment.

Moreover, because thermocompression bonding was used for batch lamination and integration of the layers, the bonding between the inner layer substrates 49, the IC chip accommodating inner layer substrate 81 and the IC chip 17 is strong, enabling the production of a high precision, finely detailed, and high density IC chip integrated multilayer wiring board with superior mechanical strength.

Third Embodiment

Figure 13:
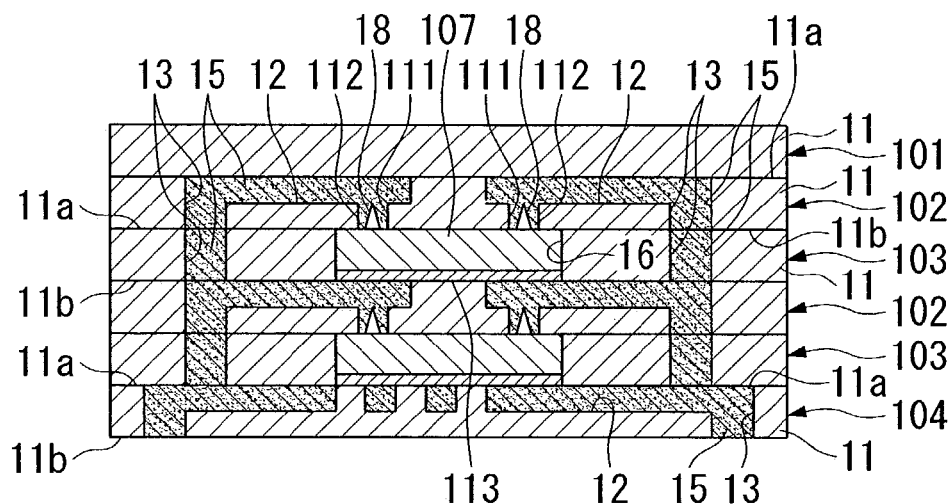
FIG. 13 is a cross-sectional diagram showing an IC chip integrated multilayer wiring board of a third embodiment of the present invention.

FIG. 13 is a cross-sectional diagram showing an IC chip (semiconductor device) integrated multilayer wiring board of a third embodiment of the present invention. In the figure, symbol 101 represents an uppermost layer substrate (a wiring substrate of the uppermost layer), symbol 102 represents an IC chip (semiconductor device) mounted inner layer substrate (wiring substrate), symbol 103 represents an apertured (open) inner layer substrate (wiring substrate), and symbol 104 represents a lowest layer substrate (a wiring substrate of the lowest layer).

The uppermost layer substrate 101 is typically a film, a thin plate or a sheet of a thickness of no more than 100 μm, constructed from an insulating substrate 11 formed from a film, a thin plate or a sheet of a thermoplastic resin composition comprising a polyarylketone resin with a crystalline melting peak temperature of at least 260° C. and an amorphous polyetherimide resin as the primary constituents.

The IC chip mounted inner layer substrate 102 comprises an insulating substrate 11 of exactly the same shape as the uppermost layer substrate 101, with grooves 12 for forming a wiring circuit formed in a surface (one surface) 11a of the insulating substrate 11, and via holes 13 formed which pass through the insulating substrate 11. In addition, via holes (through holes) 111 which pass through the insulating substrate 11 are also formed within the grooves 12 in positions corresponding with each of the terminals 18 of an IC chip (semiconductor device) 107 which is to be mounted, and these grooves 12 and the via holes 13, 111 are filled with a conductive material 15 formed by curing a conductive paste. The surface 11a of the insulating substrate 11 including the conductive material 15, and the rear surface (the opposite main surface) 11b have been smoothed and flattened.

The conductive material 15 used to fill the via holes 111 forms stud bumps 112, and the IC chip 107 is mounted onto the rear surface 11b of the insulating substrate 11 so that the terminals 18, 18 of the IC chip 107 are connected electrically to the wiring circuit via these stud bumps 112, 112.

In addition, an insulating film 113 formed from an insulating resin is formed across the entire surface (the lower surface in the figure) of the IC chip 107 in order to ensure good electrical insulation relative to the adjacent IC chip mounted inner layer substrate 102 and the lowest layer substrate 104.

This insulating resin may be any resin which provides good adhesion to the IC chip 107 and the insulating substrate 11, and also displays good reflow heat resistance, and suitable examples include coatings formed from polyimides or polyamideimides and the like.

The apertured inner layer substrate 103 comprises an insulating substrate 11 of exactly the same shape as the uppermost layer substrate 101, with via holes 13 passing through the insulating substrate 11, and a conductive material 15 formed by curing a conductive paste used to fill these via holes 13. In addition, an aperture 16 for accommodating the IC chip 107 is formed in a predetermined position in the insulating substrate 11. The surface 11a of the insulating substrate 11 including the conductive material 15, and the rear surface 11b have been smoothed and flattened.

The lowest layer substrate 104 comprises an insulating substrate 11 of exactly the same shape as the uppermost layer substrate 101, with grooves 12 for forming a wiring circuit formed in one surface 11a of the insulating substrate 11, and via holes 13 formed which pass through the insulating substrate 11. These grooves 12 and the via holes 13 are filled with a conductive material 15 formed by curing a conductive paste, and the surface 11a of the insulating substrate 11 including the conductive material 15, and the rear surface 11b have been smoothed and flattened.

A total of 4 layers of alternate apertured inner layer substrates 103 and IC chip mounted inner layer substrates 102 are laminated onto the lowest layer substrate 104, and the uppermost layer substrate 101 is then laminated on top of the uppermost IC chip mounted inner layer substrate 102.

Next is a description of a method of manufacturing an IC chip integrated multilayer wiring board of the present embodiment, based on FIG. 14A through FIG. 16.

First is a description of a method of manufacturing each of the substrates and a method of forming an insulating film on an IC chip, followed by a description of a method of batch laminating all of these substrates.

(1) Uppermost Layer Substrate

Figure 16:
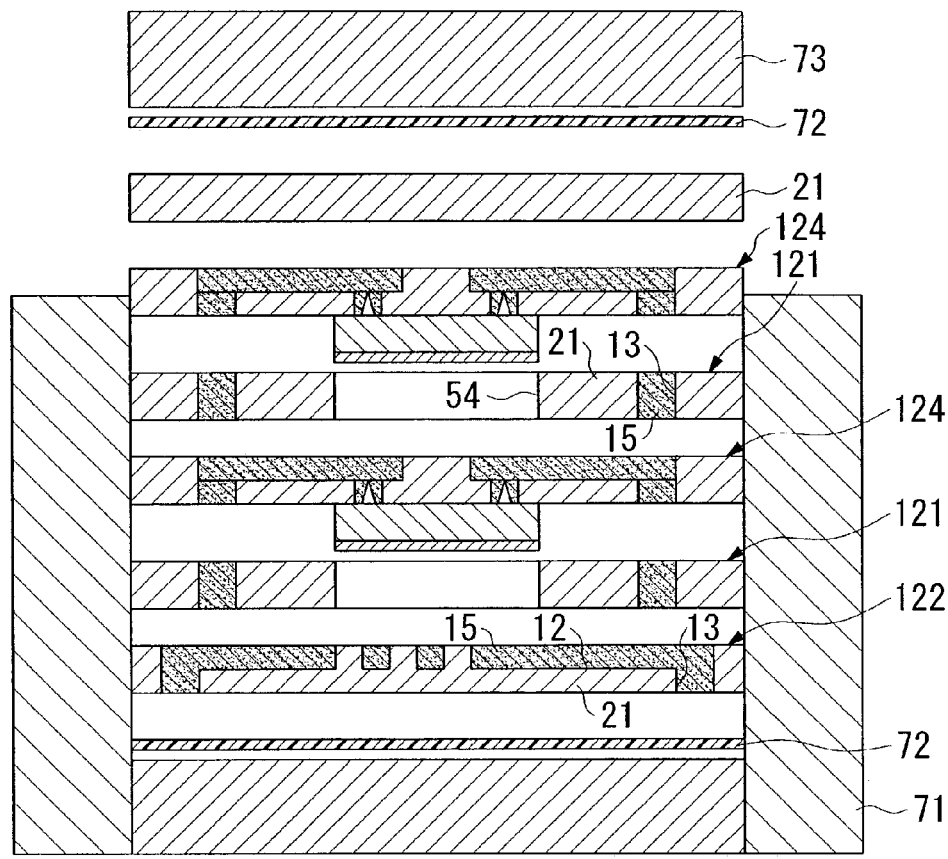
FIG. 16 is a process diagram showing a method of manufacturing an IC chip integrated multilayer wiring board of the third embodiment of the present invention.

Following the method of manufacturing an uppermost layer substrate according to the first embodiment, an insulating substrate 21 shown in FIG. 16 is prepared from a thermoplastic resin composition comprising a polyarylketone resin with a crystalline melting peak temperature of at least 260° C. and an amorphous polyetherimide resin as the primary constituents.

(2) Apertured Inner Layer Substrate

Following the method of manufacturing an apertured inner layer substrate (part 2) according to the first embodiment, an apertured inner layer substrate 121 shown in FIG. 16 is prepared, with the via holes 13 in the insulating substrate 21 filled with a conductive material 15, and an aperture 54 formed for accommodating an IC chip.

(3) Lowest Layer Substrate

Following the method of manufacturing a solid inner layer substrate according to the first embodiment, a lowest layer substrate 122 shown in FIG. 16 is prepared, by forming wiring circuit formation grooves 12 and via holes 13 in the surface of the insulating substrate 21, and then filling these grooves 12 and via holes 13 with a conductive material 15.

(4) Formation of an Insulating Film on an IC Chip

Figure 14A:
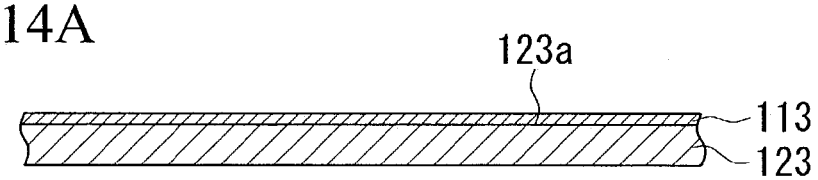
FIG. 14A and FIG. 14B are process diagrams showing a method of manufacturing an IC chip integrated multilayer wiring board of the third embodiment of the present invention.
Figure 14B:
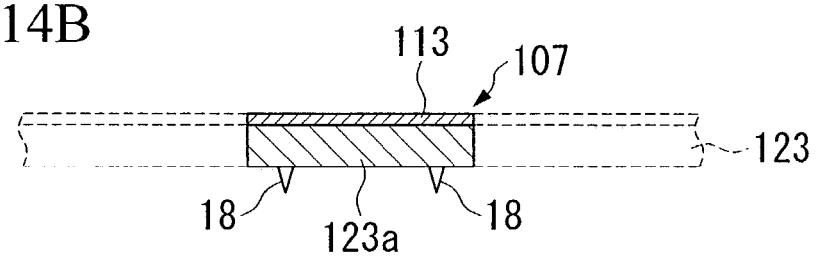

As shown in FIG. 14A, an insulating film 113 formed from an insulating resin is formed across the entire rear surface 123a of a semiconductor wafer, using a method such as vapor deposition, spin coating, dipping (an immersion method), dispensing (a method of discharging liquid droplets) or laminate bonding. Subsequently, as shown in FIG. 14B, a predetermined section of this semiconductor wafer 123 is cut out using a wire saw or a diamond cutter to form a chip 123a, and terminals 18, 18 are then attached to the chip 123a, forming an IC chip 107 with an insulating film 113 formed across the entire rear surface.

(5) IC Chip Accommodating Inner Layer Substrate

Figure 15A:
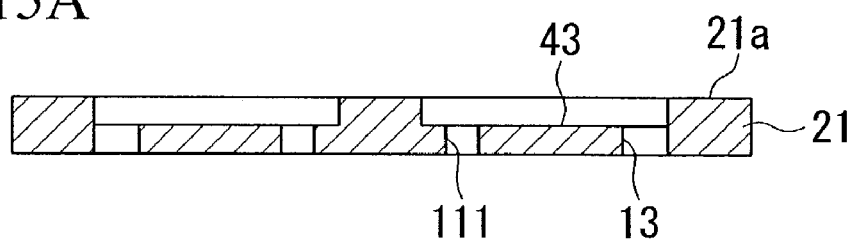
FIG. 15A through FIG. 15C are process diagrams showing a method of manufacturing an IC chip integrated multilayer wiring board of the third embodiment of the present invention.

As shown in FIG. 15A, wiring circuit formation groves 43 are first formed in the surface 21a of an insulating substrate 21, in a similar manner to that described for the inner layer substrate 50 of the first embodiment. Subsequently, a laser or a mechanical drill or the like is used to form via holes 13 which pass through the insulating substrate 21, and also form via holes 111 which pass through the insulating substrate 11 at positions within the grooves 12 which correspond with each of the terminals 18 of the IC chip 107. These via holes 13, 111 may also be formed by a stamper, at the same time as the formation of the wiring circuit formation grooves 43.

Figure 15B:
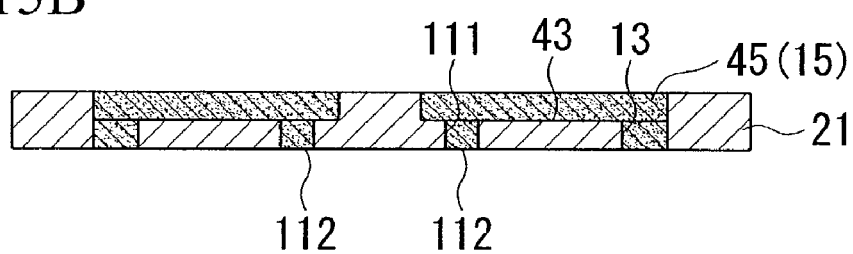

Next, as shown in FIG. 15B, the wiring circuit formation grooves 43 and the via holes 13, 111 are filled with a conductive paste 45 using a squeegee printing technique or the like. Subsequently, this conductive paste 45 is heated for 30 to 60 minutes at a temperature of 120 to 160° C., thereby curing the paste and forming a conductive material 15. As a result of this process, a conductive circuit, interlayer continuity sections and stud bumps 112, 112 formed from the conductive material 15 are formed at predetermined positions on the insulating substrate 21.

Subsequently, a sanding device is used to grind off and remove any residual conductive material 15 left on the surface of the insulating substrate 21, and smooth the surface of the insulating substrate 21.

Figure 15C:
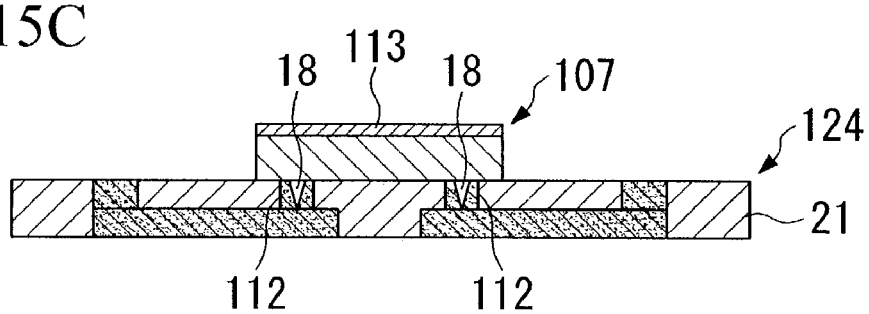

Next, as shown in FIG. 15C, the terminals 18, 18 of the IC chip 107 are aligned with the stud bumps 112, 112, and using a compression jig, the IC chip 107 is pressed from the side of the insulating film 113, thereby embedding the terminals 18, 18 of the IC chip 107 in the stud bumps 112, 112 of the insulating substrate 21 and, completing the preparation of the IC chip accommodating inner layer substrate 124.

(6) IC Chip Integrated Multilayer Wiring Board

First, as shown in FIG. 16, a cushion film 72 with good elasticity and releasability, a lowest layer substrate 122, an apertured inner layer substrate 121, an inverted IC chip accommodating inner layer substrate 124, a apertured inner layer substrate 121, an inverted IC chip accommodating inner layer substrate 124, an insulating substrate 21, and another cushion film 72 with good elasticity and releasability are overlaid, in the above sequence, within a lamination jig 71 with an internal heater. Subsequently, by pressing a compression jig 73 downward, the layers from the lowest layer substrate 122 through to the insulating substrate 21 are subjected to thermocompression bonding, thereby laminating the layers from the lowest layer substrate 122 through to the insulating substrate 21 together, and forming a single integrated unit.

This thermocompression bonding is effective if performed at a temperature greater than the glass transition temperature (Tg) but lower than the crystalline melt temperature (Tm) of the thermoplastic resin composition of the insulating substrate 21.

An example of suitable conditions for the thermocompression bonding includes a temperature within a range from 220 to 300° C., and a pressure from 10 to 60 kg/cm$^2$.

The above process enables the production of an IC chip integrated multilayer wiring board of the present embodiment.

This third embodiment produces similar effects to those described for the IC chip integrated multilayer wiring boards of the first and second embodiments.

Moreover, because stud bumps 112 were formed from the conductive material 15, and the terminals 18, 18 of the IC chip 107 were then embedded into these stud bumps 112, 112, the electrical connections of the IC chip can be improved.

In addition, because an insulating film 113 formed from an insulating resin was formed across the entire surface of the IC chip 107, a good level of electrical insulation can be maintained between the IC chip 107 and the adjacent IC chip mounted inner layer substrate 102 or the lowest layer substrate 104, thereby removing the requirement to form a passivation film on the IC chip.

Fourth Embodiment

Figure 17:
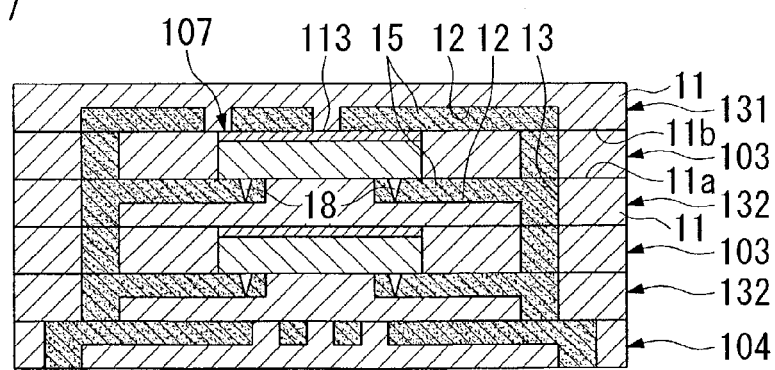
FIG. 17 is a cross-sectional diagram showing an IC chip integrated multilayer wiring board of a fourth embodiment of the present invention.

FIG. 17 is a cross-sectional diagram showing an IC chip (semiconductor device) integrated multilayer wiring board of a fourth embodiment of the present invention. In the figure, symbol 131 represents an uppermost layer substrate (a wiring substrate of the uppermost layer) and symbol 132 represents an IC chip (semiconductor device) mounted inner layer substrate (wiring substrate), and the multilayer wiring board is formed by laminating the uppermost layer substrate 131, an apertured inner layer substrate 103, the IC chip mounted inner layer substrate 132, an apertured inner layer substrate 103, another IC chip mounted inner layer substrate 132, and a lowest layer substrate 104.

The uppermost layer substrate 131 is typically a film, a thin plate or a sheet of a thickness of no more than 100 µm, wherein grooves 12 for forming a wiring circuit are formed in the rear surface 11b of an insulating substrate 11 formed from a film, a thin plate or a sheet of a thermoplastic resin composition comprising a polyarylketone resin with a crystalline melting peak temperature of at least 260° C. and an amorphous polyetherimide resin as the primary constituents, a conductive material 15 formed by curing a conductive paste is used to fill the grooves 12, and the rear surface 11b of the insulating substrate 11 including the conductive material 15 is smoothed and flattened.

The IC chip mounted inner layer substrate 132 comprises an insulating substrate 11 of exactly the same shape as the uppermost layer substrate 131, with grooves 12 for forming a wiring circuit formed in the surface 11a of the insulating substrate 11, via holes 13 formed which pass through the insulating substrate 11, and the grooves 12 and the via holes 13 filled with a conductive material 15 formed by curing a conductive paste. The surface 11a of the insulating substrate 11 including the conductive material 15, and the rear surface 11b have been smoothed and flattened. Furthermore an IC chip 107, with an insulating film 113 formed from an insulating resin formed across the entire surface thereof, is mounted onto the insulating substrate 11, and the terminals 18, 18 of this IC chip 107 are connected electrically to the wiring circuit via the conductive material 15.

The method of manufacturing an IC chip integrated multilayer wiring board of the present embodiment is almost identical with the method of manufacturing an IC chip integrated multilayer wiring board of the third embodiment, and as such the description is omitted here.

This fourth embodiment produces similar effects to those described for the IC chip integrated multilayer wiring board of the third embodiment.

In addition, because the terminals 18, 18 of the IC chip 107 are connected directly to the conductive material 15, there is no need to form the through holes 111 for generating the stud bumps 112, and consequently the manufacturing process can be shortened, thereby reducing the manufacturing costs.

What is claimed is:

1. A semiconductor device integrated multilayer wiring board comprising a plurality of wiring substrates laminated together, each of said plurality of wiring substrates including:

an insulating substrate consisting substantially of a thermoplastic resin composition having, as primary constituents, a polyarylketone resin with a crystalline melting peak temperature of at least 260° C. and an amorphous polyetherimide resin;

a first conductive wiring embedded within one or more grooves formed in a surface of said insulating substrate, said first conductive wiring having a surface which is substantially flush with said surface of said insulating substrate; and a second conductive wiring comprising a cured conductive paste disposed within via holes in said the insulating substrate, for electrically connecting said wiring substrates to each other, wherein insulating substrates includes a semiconductor device accommodated in an aperture formed therein, wherein at least one horizontal surface of said semiconductor device is flush with a surface of said first conductive wiring, wherein a thickness of said first conductive wiring is less than that of said semiconductor device, and wherein said wiring substrates are laminated and bonded together.

2. A semiconductor device integrated multilayer wiring board according to claim 1, wherein said insulating substrate is formed from an amorphous film produced by molten mixing and rapid cooling of a thermoplastic resin composition comprising a polyarylketone resin with a crystalline melting peak temperature of at least 260° C. and an amorphous polyetherimide resin as primary constituents, and a difference between a glass transition temperature and a crystallization start temperature of said amorphous film is within a range from 30° C. to 60° C.

3. A semiconductor device integrated multilayer wiring board according to claim 1, wherein an insulating film is formed on at least a main surface of said semiconductor device and on an opposite side of said semiconductor device of which electrical connections to said wiring substrate are provided.

4. A semiconductor device integrated multilayer wiring board according to claim 1, wherein via holes are formed in said wiring substrate on which said semiconductor device is mounted, in positions corresponding with each terminal of said semiconductor device, said via holes are filled with a conductive material, and each terminal of said semiconductor device is connected electrically to said conductive material provided in said via hole.

5. A semiconductor device integrated multilayer wiring board according to claim 1, wherein said conductive wiring in at least one of said first wiring substrates is made of said conductive material produced by curing said conductive paste.

6. A semiconductor device integrated multilayer wiring board according to claim 1, wherein two surfaces of said semiconductor device are flush with surfaces of the insulating substrate.

7. A semiconductor device integrated multilayer wiring board according to claim 1, wherein a thickness of said semiconductor device is substantially the same as that of the insulating substrate.

* * * * *